(12) United States Patent
Gross, Jr. et al.

(10) Patent No.: US 6,255,972 B1
(45) Date of Patent: Jul. 3, 2001

(54) CONFIGURABLE DATA CONVERTER

(75) Inventors: George F. Gross, Jr., Fleetwood; Gregory A. Hughes, Bethlehem, both of PA (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/339,195

(22) Filed: Jun. 24, 1999

(51) Int. Cl.[7] .................................................. H03M 1/00
(52) U.S. Cl. ................................................................. 341/126
(58) Field of Search .................................. 341/126, 144, 341/155

(56) References Cited

U.S. PATENT DOCUMENTS 4,609,906 * 9/1986 Wiegel .................................. 341/155

* cited by examiner

*Primary Examiner*—Brian Young
(74) *Attorney, Agent, or Firm*—William H. Bollman

(57) ABSTRACT

A/D converter or as a D/A converter forms a data converter embedded in a digital circuit for reconfigurable use. Conversion parameters of the data converter are controlled on a bitwise basis from a bitwise converter configuration register. For instance, output locations (i.e., time slots) of the data converter are determined by a bitwise converter configuration register, as is the selection of a D/A conversion mode or A/D conversion mode of the data converter for that particular output location, and/or the output sample length are controlled by appropriate signals from the bitwise converter configuration register. The bitwise converter configuration register also preferably configures the input source to the data converter and/or to an interface, e.g., to a parallel-to-serial, serial-to-serial, or parallel-to-parallel interface device, on a bitwise basis, to provide flexibility both in the source of the channels as well as the output location of particular channels in the data frame.

24 Claims, 5 Drawing Sheets

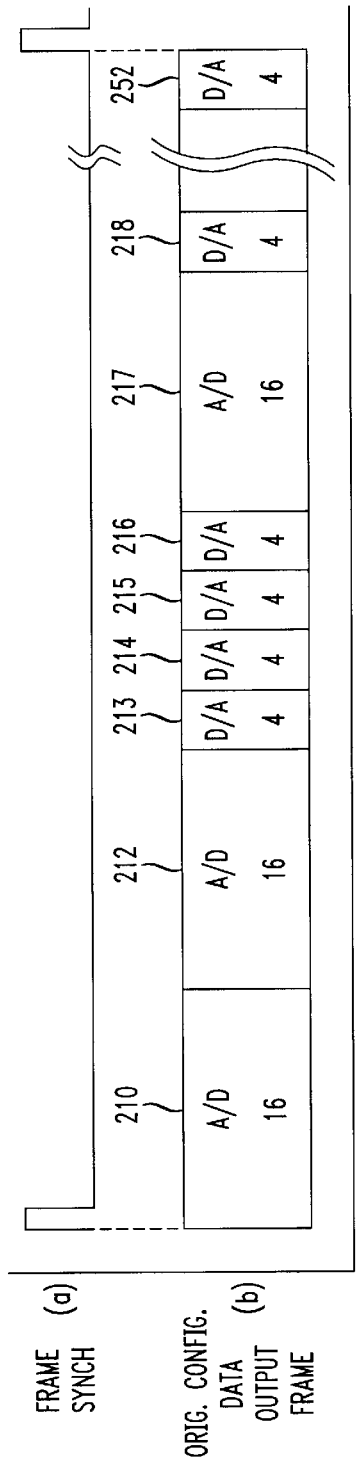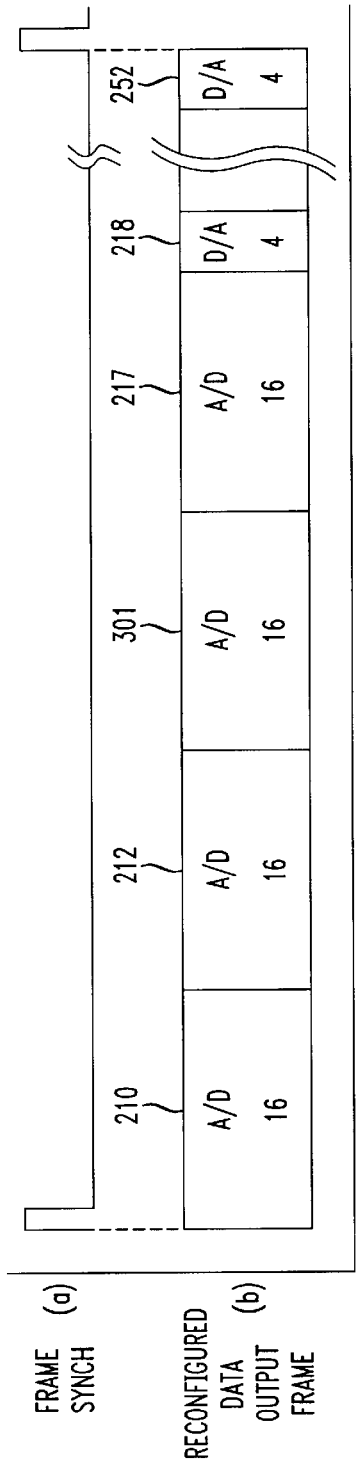

CONFIGURABLE DATA CONVERTER

BACKGROUND OF THE INVENTION

1. Field of the Invention

The present invention relates generally to analog-to-digital (A/D) and digital-to-analog (D/A) converters. More particularly, it relates to an improved architecture design including a configurable embedded data converter.

2. Background of Related Art

Many, many digital devices are utilized by consumers throughout the world. Many of these digital devices translate or convert an analog signal into a digital signal, and/or a digital signal back into an analog signal. For instance, compact disk (CD) players convert a digital signal read from a CD back into an analog signal for audible output by speakers. Moreover, telephone equipment such as digital cordless telephones and digital telephone answering devices convert between an analog signal (e.g., from a microphone) into a digital signal for digital transmission from a remote handset to a base unit (digital cordless telephone) or for digital storage in appropriate non-volatile memory (telephone answering device).

Efficient and inexpensive digitization of telephone grade audio has been accomplished for many years by an integrated device known as a "codec." A codec (short for COder-DECoder) is an integrated circuit or other electronic device which combines the circuits needed to convert analog signals to and from Pulse Code Modulation (PCM) digital signals.

Early codecs converted analog signals at an 8 KHz rate into 8-bit PCM for use in telephony. More recently, the efficiency and low cost advantages of codecs have been expanded to convert analog signals at a 48 KHz sampling rate into 16-bit stereo (and even up to 20-bit stereo) for higher quality use beyond that required for telephony. With higher quality audio capability, today's codecs find practical application in consumer stereo equipment including CD players, modems, computers and digital speakers.

With the development of codecs for these more sophisticated purposes came the need to improve the analog signal-to-noise (S/N) ratio to at least 75 to 90 dB. Improved S/N ratios have been achieved largely by separating the conventional codec into two individual sub-systems and/or two separate integrated circuits (ICs): a controller sub-system handling primarily the digital interface to a host processor, and an analog sub-system handling primarily the interface to, mixing and conversion of analog signals. This split digital/analog architecture has been documented most recently as the "Audio Codec '97 Component Specification", Revision 1.03, Sep. 15, 1996, as revised in "Audio Codec '97", Revision 2.0, Sep. 29, 1997 (collectively referred to herein as "the AC '97 specification"). The AC '97 specification in its entirety is expressly incorporated herein by reference.

FIG. 5 is a generalized block diagram of a conventional split-architecture audio codec conforming to the AC '97 specification. Audio codecs conforming to the AC '97 specification accommodate audio sources from CD players, auxiliary devices such as stereo equipment, microphones and/or telephones.

As shown in FIG. 5, currently known split-architecture audio codecs contemplate a host processor, an audio codec (AC) controller sub-system or IC 402, and an AC analog sub-system or IC 404. The connection between the AC controller sub-system 402 and the AC analog sub-system 404 is currently defined as a five-wire time division multiplexed (TDM) interface controlled by an AC-link 406 in the AC analog sub-system 404. The AC link 406 includes one serial output data line and one serial input data line, both synchronized to a frame pulse synchronization signal.

The AC controller sub-system 402 may be a stand alone device, or it may be a portion of a larger device such as a Peripheral Component Interconnect (PCI) interface device. PCI is a processor-independent, self-configuring local bus. Alternatively, the AC controller sub-system 402 may be a part of a central processing unit (CPU).

Because of the capabilities of the split digital/analog architecture (i.e., AC controller sub-system 402 and AC analog subs system 404), the AC '97 specification includes a significant amount of flexibility intended to capture a large market by satisfying many consumer-related audio needs. For instance, the conventional AC analog sub-system 404 includes interface capability to accept input from multiple sources and to mix the analog signals from those multiple sources. Possible analog signal sources include a CD, video, or telephone line.

FIG. 6 is a diagram showing relevant features of the conventional AC analog sub-system 404.

In particular, FIG. 6 shows a conventional brute force use of as many of a plurality of digital-to-analog (D/A) converters 204a, 204b and a plurality of analog-to-digital (A/D) converters 206a–206c are needed to convert between analog signals used by the analog mixing and gain control module 200 and the digital interface 202. The designer in such a system determines beforehand the maximum number of D/A and/or A/D converters necessary to fulfill the particular application, and then implements that number of separate D/A and or A/D converters in a suitable device.

The AC link 406 includes input and output time division multiplexed (TDM) serial data lines, each including "time slots" for use by a particular D/A or A/D converter. The D/A converters 204a, 204b input from respective appropriate time slots of an input TDM serial line of the AC link 406, while the A/D converters 206a–206c output to respective appropriate time slots of an output TDM serial line of the AC link 406.

The TDM serial lines are synchronized into data frames, each data frame containing a plurality of time slots. For instance, a particular data frame may refresh every 256 cycles of a data clock (e.g., a 4 MHz data clock). The frames are conventionally synchronized with a frame synchronization signal or similar signal.

Depending upon the bit length of the data samples output from the AND converters 206a–206c, and/or upon the bit length of the data samples input to the D/A converters 204a, 204b, each data frame is conventionally designed to contain fixed locations for data samples from each of the A/D and D/A converters. Thus, based on a designed configuration, conventional input and output TDM serial data streams for embedded converters have fixed locations within a data frame based on maximum sample lengths.

Unfortunately, to change such systems having fixed time slot configurations for A/D and/or D/A input and output with respect to the data frame synch signal, the embedded circuit must be redesigned with the development of a new chip. For instance, to add an A/D and/or D/A channel beyond those previously included in a device, or to increase the sample length of a particular converter beyond its previous maximum expected length, additional space for additional components, reconfiguration of time slots, and/or additional power consumption will be required.

There is thus a need for a more flexible architecture allowing the addition of new A/D and/or D/A data channels, and/or the increase in sample lengths, in an embedded converting system without the need to reengineer and/or re-manufacture the component to accommodate the change, and/or the increase in sample lengths.

SUMMARY OF THE INVENTION

In accordance with the principles of the present invention, an embedded digital system comprises a data converter, and a converter configuration register adapted to changeably define a conversion mode of the data converter on a bitwise basis with respect to a data frame.

A method of selectably configuring a serial data frame including a plurality of conversion data comprises setting a conversion mode of a data converter for a particular one of a plurality of conversions performed by the data converter, and defining a location for an output of the particular conversion in the data frame.

BRIEF DESCRIPTION OF THE DRAWINGS

Features and advantages of the present invention will become apparent to those skilled in the art from the following description with reference to the drawings, in which:

FIG. 2A shows an exemplary output data frame of the TDM output data frame signal from the data converter shown in FIG. 1.

FIG. 2B shows a reconfiguration of the exemplary output data frame shown in FIG. 2A.

DETAILED DESCRIPTION OF ILLUSTRATIVE EMBODIMENTS

The present invention embeds a codec for use either as a successive approximation A/D converter or as a D/A converter (hereinafter "data converter") for reconfigurable use in a digital device. The data converter is controlled in a bitwise fashion for configurable and reconfigurable adaptation to the A/D and/or D/A conversion requirements of a particular application.

The output locations (i.e., time slots) of the data converter are determined by a bitwise converter configuration register, as is the selection of a D/A conversion mode or A/D conversion mode of the data converter for that particular output location. The selected portion of the output data frame contains either an analog-to-digital (A/D) conversion or a digital-to-analog (DIA) conversion with respect to a frame synchronization signal.

Moreover, in the preferred embodiment, the input sources to the data converter are selected in coordination with the defined output location and conversion mode to provide adaptability to different applications without the need to add new A/D and/or D/A converters for new applications of an already-designed chip.

Many digital signal processor (DSP) architectures include on-chip data converters for acquisition/transmission of information across data lines. This is especially true in telephony applications where multiple voice channels and status information are processed by the DSP, then stored or transmitted. In some cases, multiple converters are used while in other cases a single time-shared converter is employed. In applications such as these, time slots on a per frame basis are dedicated to analog-to-digital (A/D) or digital-to-analog (D/A) conversion of specific signals.

The present invention provides a software configurable data converter where not only input and output ports are directable, but also the conversion mode itself. Thus, by a simple software command, an entire data frame can be reconfigured to suit the needs of the particular application. This configurability and reconfigurability allows for greater ease and speed in testing as well as the ability for the same DSP chip to serve multiple diverse applications.

Figure 1:
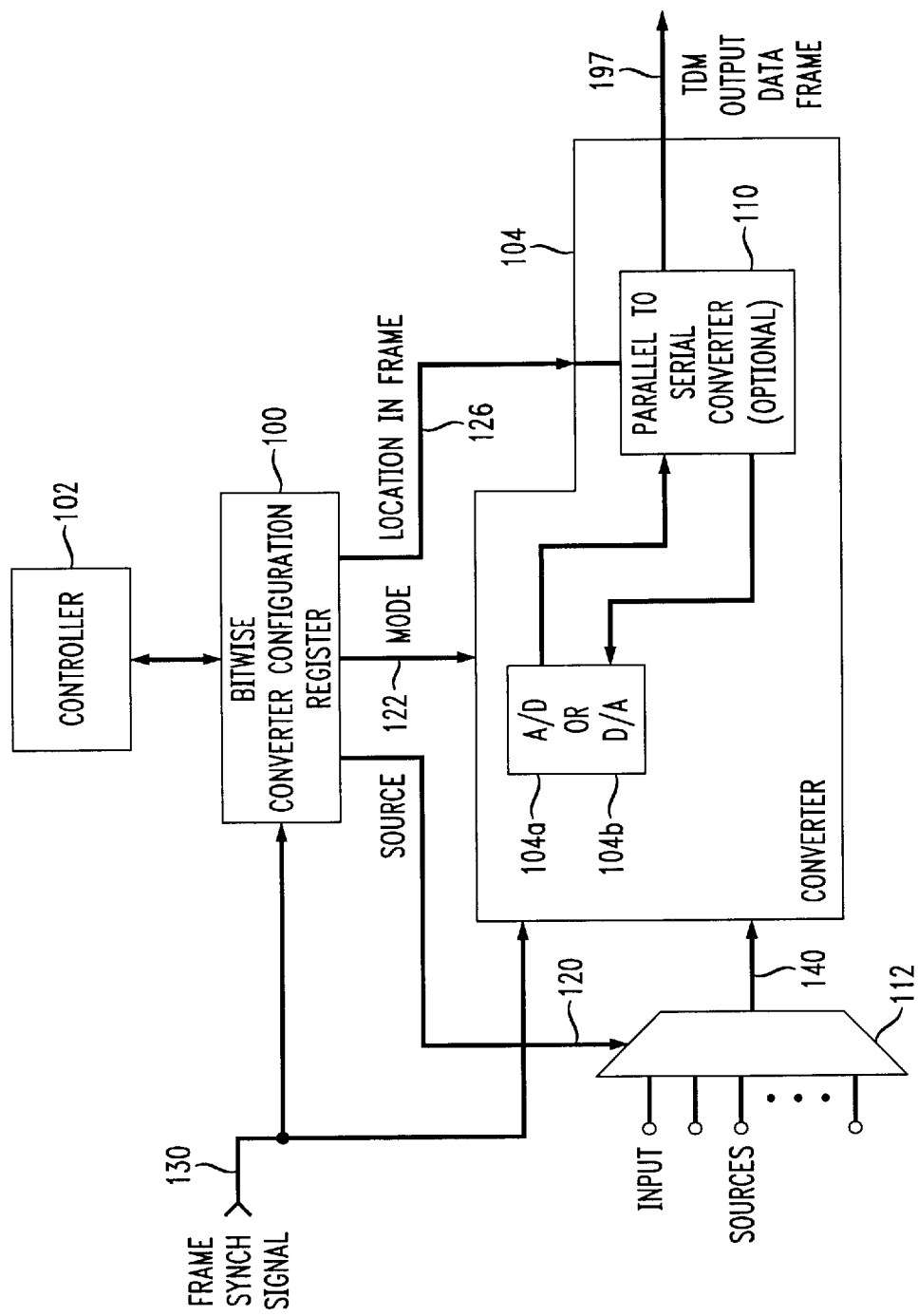
FIG. 1 shows a block diagram of an exemplary embodiment showing the configurable use of a codec as either a successive approximation A/D converter or as a D/A converter (hereinafter "data converter") during different portions of a single output data stream, in accordance with the principles of the present invention.

FIG. 1 shows a block diagram of an exemplary embodiment showing the configurable use of a codec as either a successive approximation A/Dconverter or as a D/A converter during different portions of a single output data stream, in accordance with the principles of the present invention.

In particular, FIG. 1 shows a controller 102 for controlling the overall operation of an embedded data converter. The controller 102 may be any suitable processor, e.g., a microprocessor, a microcontroller, or a digital signal processor (DSP).

A data converter 104, e.g., as shown in FIG. 1, receives any of a plurality of inputs for any particular clock cycle of a data frame as selected by a suitable multiplexer 112. Although the inputs are shown as being selected by a multiplexer 112, any suitable device which selects a particular source on a bitwise basis may be used.

As is known, a data converter such as that shown in FIG. 1 can be operated as either an A/D converter or as a D/A converter. This reversibility is depicted as an A/D converter 104a and a D/A converter 104b within the data converter 104 shown in FIG. 1.

The configuration (e.g., conversion mode and output location in the data frame) of the data converter 104 are controlled by a suitable register, e.g., a bitwise converter configuration register 100 as shown in FIG. 1. Exemplary configuration control information includes a source signal 120 controlling a multiplexing function allowing any of a plurality of input source signals to be input to the data converter 104 at any cycle of the data frame. Other configuration control information stored and output by the bitwise converter configuration register 100 includes a converter mode signal 122 to direct the conversion mode of the data converter 104 at the relevant portion of the data frame.

The bitwise converter configuration register also preferably configures the input source to the data converter 104 and/or the parallel-to-serial output converter, on a bitwise basis to provide flexibility in the location of particular channels in the data frame.

The bitwise converter configuration register 100 is programmed by the controller 102 to configure the data converter 104 on a bitwise basis for each bit or cycle of a data frame (i.e., as demarcated by the frame synch signal 130). Thus, the software configurable bitwise converter configuration register allows configuration of the mode of the data converter 104, e.g., to operate as either a successive approximation A/D converter or as a D/A converter at any particular point in a data frame The data converter 104 may include a parallel to serial converter 110, which outputs various conversion data in serial form in response to a location signal 126 timed with respect to a synchronizing frame synch signal 130. Of course, parallel to parallel or serial to serial data transfer is also possible within the principles of the present invention.

The timing of the location signal 126 establishes the location within the data frame, and therefore the time slot, of the particular data sample.

FIG. 2A shows an exemplary output data frame of the TDM output data frame signal 197 from the data converter shown in FIG. 1.

In particular, frame time-slot depiction (b) of FIG. 2A shows an example data frame containing a plurality of samples from channels 210–218 and 252 output from the data converter 104 during a data frame demarcated by a frame synch signal as shown in waveform (a) of FIG. 2A. As shown in the example of FIG. 2A, a first channel is formed by the output of the data converter 104 by the conversion of an analog signal into a 16 bit output sample 210. Similarly, a second channel 212 and seventh channel 217 contain outputs from the data converter 104 while programmed to be in an A/Dconversion mode. Furthermore, the example of frame time-slot depiction (b) of FIG. 2A shows third through sixth channels 213–216, eighth channel 218, and last channel outputs from the data converter 104 while operating in a digital to analog conversion mode as directed by the bitwise converter configuration register 100.

In accordance with the principles of the present invention, the configuration of the conversions performed by the embedded converter circuit can be reconfigured as desired. Thus, as an example, FIG. 2B shows a reconfiguration of the exemplary output data frame shown in FIG. 2A.

In particular, FIG. 2B shows the replacement of the third through sixth D/A channels 213–216 (FIG. 2A) with a new, single A/D channel 301.

Figure 3:
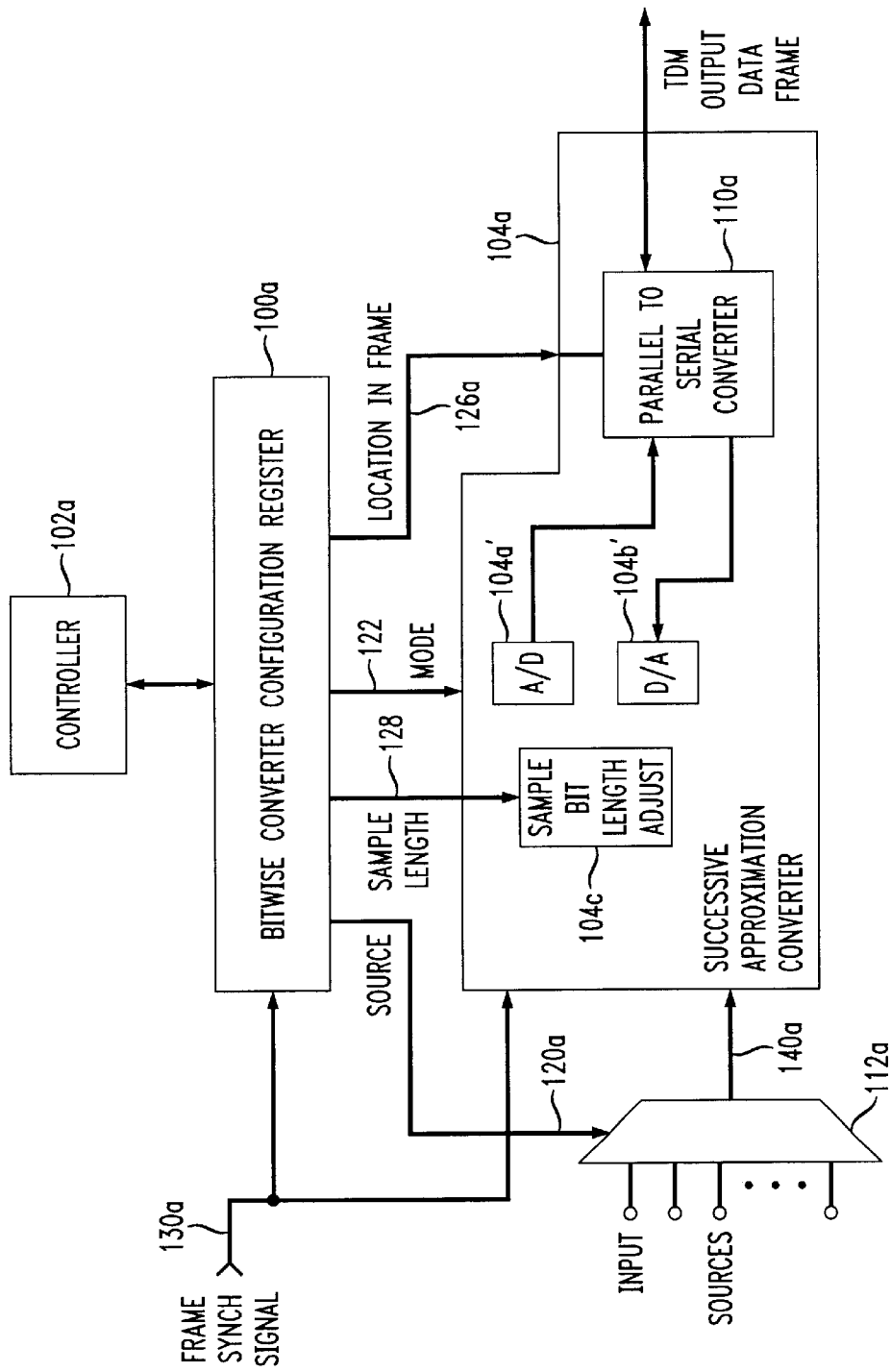
FIG. 3 shows a block diagram of another exemplary embodiment showing the configurable use of a codec as either a successive approximation A/D converter or as a D/A converter during different portions of a single output data stream, in accordance with the principles of the present invention.

FIG. 3 shows a block diagram of another exemplary embodiment showing the configurable use of a codec as either a successive approximation A/D converter or as a D/A converter during different portions of a single output data stream, in accordance with the principles of the present invention.

Although shown as controlling the input source to the data converter 104a, the conversion mode (i.e., A/D or D/A), and the location within the data frame, the bitwise converter configuration register 100a may control other configuration parameters of the data converter 104a. For instance, as shown in FIG. 3, if the data converter 104a is capable of adjusting the length of the output sample, then the bitwise converter configuration register 100a may include suitable information to individually control the length of each sample in a data frame output from the data converter 104a. For instance, a conversion sample length signal 128 may be output in response to configuration information provided by the controller 102a to the bitwise converter configuration register 100a.

Figure 4:
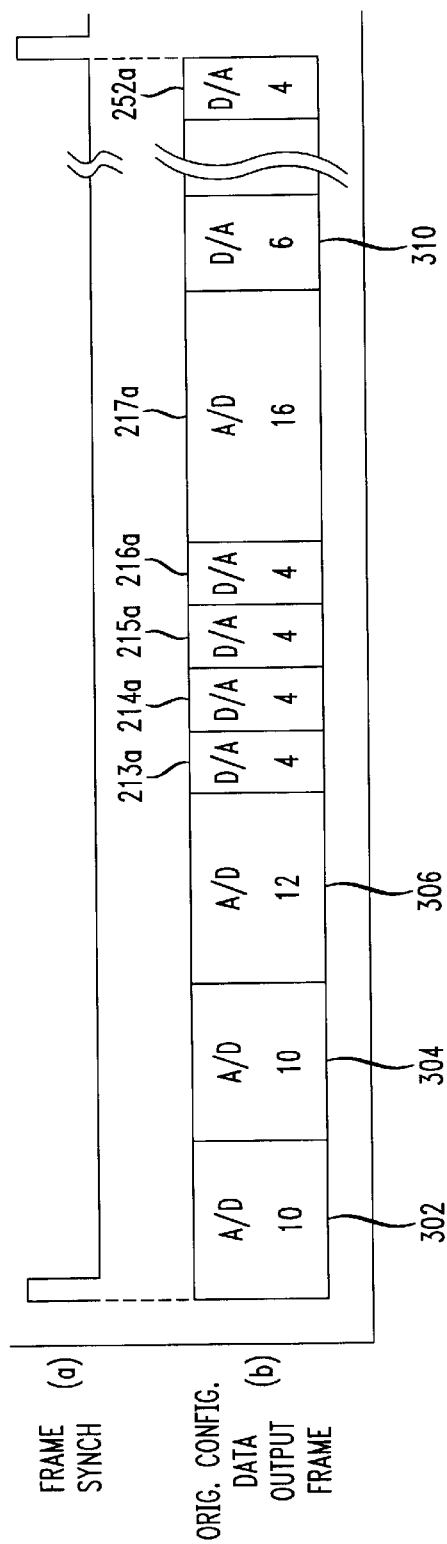
FIG. 4 shows a reconfiguration of the sample length of some channels of the exemplary output data frame shown in FIG. 2A.
Figure 5:
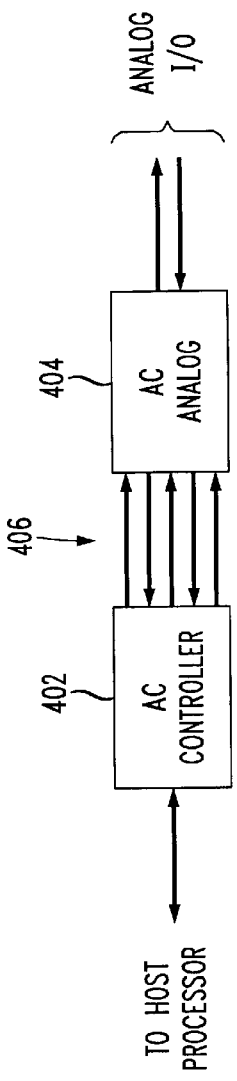
FIG. 5 is a generalized block diagram of a conventional split-architecture audio codec conforming to the AC '97 specification. Audio codecs conforming to the AC '97 specification accommodate audio sources from CD players, auxiliary devices such as stereo equipment, microphones and/or telephones.
Figure 6:
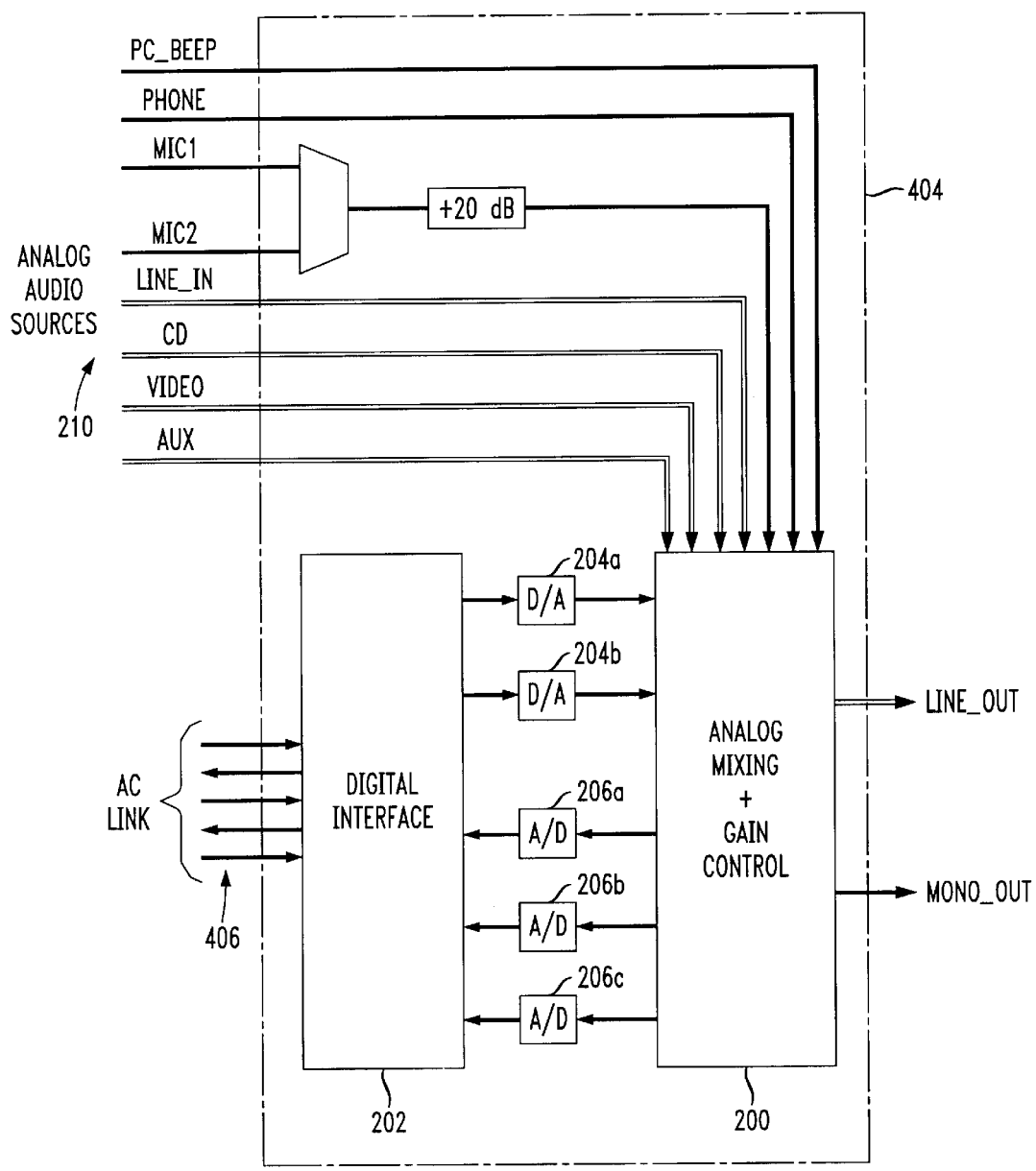
FIG. 6 is a diagram showing relevant features of the conventional AC analog sub-system 404.

To emphasize the capability to control other conversion parameters, FIG. 4 shows a reconfiguration of the sample length of some channels of the exemplary output data frame shown in FIG. 2A.

In particular, FIG. 4 shows the replacement of the two A/D channels 210, 212, each outputting 16 bit samples as shown in frame time-slot depiction (b) of FIG. 2A, with three A/D channels 302, 304, 306 of differing sample output length. For instance, as shown in frame time-slot depiction (b) of FIG. 4, the first and second new A/D channels 302, 304 are set by the sample length signal 128 from the bitwise converter configuration register 100a shown in FIG. 3 to have output sample lengths of 10 bits (or cycles of the data frame, assuming 1-bit per cycle rate of the A/D converter), while the third new A/D channel 306 is set to have an output sample length of 12 bits.

Moreover, to emphasize the capability to adjust output sample sizes on a bitwise basis in either conversion mode, the D/A channel 218 shown in frame time-slot depiction (b) of FIG. 2A is adjusted by a suitable write to the bitwise converter configuration register 100a by the controller 102a to have an input bit length of 6 bits as shown in the adjusted D/A channel 310.

If we assume a 4.096 MHz clock and a 16 KHz frame as in the exemplary embodiments, and also assume:

A. 13-bit A/D conversions require 16 cycles (1 cycle/bit+3 cycles overhead), and n-bit A/D conversions require n+3 cycles; and B. D/A conversions require 4 cycles regardless of the number of input bits (2 cycles for settling plus 2 cycles overhead).

Thus, we can configure the frame in a number of ways including, but not limited to:

EXAMPLE CONFIGURATION #1

Multiple A/D and D/A Conversions Where A/D Conversions are Fixed at a 13-bit Level

| 14 A/D, 8 D/A Operations | Running Total Cycles |
|---|---|
| 3 A/D inputs @ 64 Ksamples/sec => 12 A/D => 12 × 16 | 192 |
| 2 A/D inputs @ 16 Ksamples/sec => 2 A/D => 2 × 16 | 224 |
| 2 D/A outputs @ 32 Ksamples/sec => 4 D/A => 4 × 4 | 240 |
| 4 D/A outputs @ 16 Ksamples/sec => 4 D/A => 4 × 4 | 256 |

EXAMPLE CONFIGURATION #2

Single A/D Input Source at Maximum Conversion Rate

| 1 A/D Operation | Running Total Cycles |
|---|---|
| 1 A/D input @ 256 Ksamples/sec => 16 A/D => 16 × 16 | 256 |

EXAMPLE CONFIGURATION #3
Single D/A Output at Maximum Conversion Rate

| 1 D/A Operation | Running Total Cycles |
|---|---|
| 1 D/A output @ 1024 Ksamples/sec => 64 D/A => 64 × 4 | 256 |

If we now change the bit level to 5 instead of 13 for A/D conversions, then the total number of cycles required for an A/D conversion equals 8.

EXAMPLE CONFIGURATION #4
Single A/D Input Source at Maximum Conversion Rate to a Bit Level of 5

| 1 A/D Operation | Running Total Cycles |
|---|---|
| 1 A/D input @ 512 Ksamples/sec => 32 A/D => 32 × 8 | 256 |

In accordance with the principles of the present invention, adding programmability to data converters embedded in a circuit such as with a DSP allows a single chip to be software reconfigured for various diverse applications. This is especially useful in telephony applications when additional features are often later added to a basic system. Moreover, the ability to stack multiple conversions of a single source input allows for greater ease and speed in testing since multiple results are obtained each frame rather than one result per frame.

While the invention has been described with reference to the exemplary embodiments thereof, those skilled in the art will be able to make various modifications to the described embodiments of the invention without departing from the true spirit and scope of the invention.

What is claimed is:

1. An embedded digital system, comprising:
    a data converter; and
    a converter configuration register adapted to changeably define a conversion mode of said data converter on a bitwise basis with respect to a data frame.

2. The embedded digital system according to claim 1, wherein:
    said data converter includes a first mode operating as a digital-to-analog converter and a second mode operating as an analog-to-digital converter.

3. The embedded digital system according to claim 2, wherein:
    said data converter functions as a successive approximation converter when operating in said analog-to-digital mode.

4. The embedded digital system according to claim 1, wherein:
    said converter configuration register selectably configures said data converter as one of a digital-to-analog converter and an analog-to-digital converter.

5. The embedded digital system according to claim 1, wherein:
    said converter configuration register selectably directs an input to said data converter on a bitwise basis.

6. The embedded digital system according to claim 1, wherein:
    said converter configuration register selectably defines a sample length of an output from said data converter for a respective portion of said data frame.

7. The embedded digital system according to claim 6, wherein:
    said sample length is at least 13 bits.

8. The embedded digital system according to claim 7, wherein:
    said portion of said data frame is at least 16 clock cycles in length.

9. A method of selectably configuring a serial data frame including a plurality of conversion data, comprising:
    setting a conversion mode of a data converter for a particular one of a plurality of conversions performed by said data converter; and
    defining a location for an output of said particular conversion in said serial data frame.

10. The method of selectably configuring a serial data frame including a plurality of conversion data according to claim 9, further comprising:
    changeably setting a sample size of each sample output from said data converter.

11. The method of selectably configuring a serial data frame including a plurality of conversion data according to claim 10, wherein:
    said sample size is at least 13 bits.

12. The method of selectably configuring a serial data frame including a plurality of conversion data according to claim 9, wherein:
    said conversion mode of said particular conversion is set to one of a digital-to-analog conversion mode and an analog-to-digital conversion mode.

13. Apparatus for selectably configuring a serial data frame including a plurality of conversion data, comprising:
    means for setting a conversion mode of a data converter for a particular one of a plurality of conversions performed by said data converter; and
    means for defining a location for an output of said particular conversion in said serial data frame.

14. The apparatus for selectably configuring a serial data frame including a plurality of conversion data according to claim 13, further comprising:
    means for changeably setting a sample size of each sample output from said data converter.

15. The apparatus for selectably configuring a serial data frame including a plurality of conversion data according to claim 14, wherein:
    said sample size is at least 13 bits.

16. The apparatus for selectably configuring a serial data frame including a plurality of conversion data according to claim 13, wherein:
    said conversion mode of said particular conversion is adapted to be set to one of a digital-to-analog conversion mode and an analog-to-digital conversion mode.

17. A method of configuring an embedded digital system, comprising:
    converting data; and
    configuring a converter register to changeably define a conversion mode of said converted data on a bitwise basis with respect to a data frame containing said data.

18. The method of configuring an embedded digital system according to claim 17, wherein:
    said step of converting data includes a first mode operating as a digital-to-analog converter and a second mode operating as an analog-to-digital converter.

19. The method of configuring an embedded digital system according to claim 16, wherein:

said step of converting data functions as a successive approximation converter when operating in said analog-to-digital mode.

20. The method of configuring an embedded digital system according to claim 17, wherein:

said step of configuring a converter register selectably configures said converted data as one of a digital-to-analog converter and an analog-to-digital converter.

21. The method of configuring an embedded digital system according to claim 17, wherein:

said step of configuring a converter register selectably directs an input to said data converter on a bitwise basis.

22. The method of configuring an embedded digital system according to claim 17, wherein:

said step of configuring a converter register selectably defines a sample length of an output from said data converter for a respective portion of said data frame.

23. The method of configuring an embedded digital system according to claim 22, wherein:

said sample length is at least 13 bits.

24. The method of configuring an embedded digital system according to claim 23, wherein:

said portion of said data frame is at least 16 clock cycles in length.

* * * * *